(12) United States Patent
Lee et al.

(10) Patent No.: US 7,981,708 B1
(45) Date of Patent: Jul. 19, 2011

(54) METHOD OF FABRICATING PIXEL STRUCTURE AND METHOD OF FABRICATING ORGANIC LIGHT EMITTING DEVICE

(75) Inventors: Liu-Chung Lee, Hsinchu County (TW); Hung-Che Ting, Taipei (TW); Chia-Yu Chen, Hsinchu County (TW)

(73) Assignee: Au Optronics Corporation, Hsinchu (TW)

( * ) Notice: Subject to any disclaimer, the term of this patent is extended or adjusted under 35 U.S.C. 154(b) by 0 days.

(21) Appl. No.: 12/908,872

(22) Filed: Oct. 20, 2010

(30) Foreign Application Priority Data

Jul. 16, 2010 (TW) .............................. 99123488 A (51) Int. Cl.
*H01L 21/00* (2006.01)
(52) U.S. Cl. .......... 438/34; 438/104; 438/149; 438/164; 438/162; 257/59; 257/E27.111; 257/E29.094
(58) Field of Classification Search .................... 438/34, 438/149, 592, 104, 162, 164; 257/43, 59, 257/E27.111, E29.094
See application file for complete search history.

(56) References Cited

U.S. PATENT DOCUMENTS

| | | |
|---|---|---|
| 6,531,330 B2 | 3/2003 | Lay et al. |
| 7,382,421 B2 | 6/2008 | Hoffman et al. |
| 2004/0129943 A1 | 7/2004 | Yoo et al. |
| 2004/0171242 A1* | 9/2004 | Monoe et al. ................. 438/592 |
| 2007/0087487 A1* | 4/2007 | Honda .......................... 438/149 |
| 2008/0121877 A1* | 5/2008 | Ender et al. ...................... 257/43 |
| 2008/0239217 A1* | 10/2008 | Inoue et al. .................... 349/114 |
| 2008/0299702 A1* | 12/2008 | Son et al. ....................... 438/104 |

FOREIGN PATENT DOCUMENTS

| | | |
|---|---|---|
| TW | I268620 | 12/2006 |
| TW | 200841475 | 10/2008 |

* cited by examiner

*Primary Examiner* — Matthew Smith
*Assistant Examiner* — Wilner Jean Baptiste
(74) *Attorney, Agent, or Firm* — Jianq Chyun IP Office (57) ABSTRACT

A method of fabricating a pixel structure is provided. A gate electrode is formed on a substrate, and a dielectric layer is formed on the gate electrode. A patterned metal oxide semiconductor layer and a patterned metallic etching stop layer are formed on the dielectric layer above the gate electrode. A first conductive layer is formed to cover the patterned metallic etching stop layer and the dielectric layer. The first conductive layer is patterned by using the patterned metallic etching stop layer as an etching stop layer to form a source and a drain. A second conductive layer is formed to cover the source, the drain and the dielectric layer. The second conductive layer is patterned by using the patterned metallic etching stop layer as an etching stop layer to form a first electrode layer. The patterned metallic etching stop layer exposed between the source and the drain is removed.

20 Claims, 11 Drawing Sheets

METHOD OF FABRICATING PIXEL STRUCTURE AND METHOD OF FABRICATING ORGANIC LIGHT EMITTING DEVICE

CROSS-REFERENCE TO RELATED APPLICATION

This application claims the priority benefit of Taiwan application serial no. 99123488, filed on Jul. 16, 2010. The entirety of the above-mentioned patent application is hereby incorporated by reference herein and made a part of this specification.

BACKGROUND

1. Field of the Invention

The invention relates to a method of fabricating a pixel structure and a method of fabricating an organic light emitting device.

2. Description of Related Art

An organic light emitting device is a self-luminous device. Generally, an active organic light emitting device includes a plurality of pixel structures, and the pixel structure includes a thin-film transistor, an anode electrically connected to the thin-film transistor, a light-emitting layer and a cathode. The thin-film transistor includes a gate electrode, a source, a drain and a channel layer.

A material of the channel layer of the thin-film transistor is generally amorphous silicon (a-Si). Generally, to reduce a contact resistance between the channel layer and the source or between the channel layer and the drain, an ohmic contact layer is generally formed on the channel layer. However, since a carrier mobility of the a-Si thin-film transistor is low and reliability thereof is poor, a metal oxide semiconductor thin-film transistor is developed.

A material of a source and a drain of the metal oxide semiconductor thin-film transistor is generally aluminium or molybdenum. However, an etchant (aluminium acid) used for etching aluminium or molybdenum does not have a high etching selectivity for a metal oxide semiconductor channel layer of the metal oxide semiconductor thin-film transistor, so that it is hard to control an etching process of the source and the drain of the metal oxide semiconductor thin-film transistor.

Moreover, according to a general fabrication process of the organic light emitting device, a thin-film transistor is first formed, and then a first organic layer is formed to cover the thin-film transistor, and a second organic layer is further formed to serve as a stop barrier of the light emitting layer of the organic light emitting device. Since such method requires two fabrication processes of the organic layers, a fabrication cost thereof is relatively high.

SUMMARY

The invention is directed to a method of fabricating a pixel structure, which can resolve a problem of uneasy control of an etching process of a source and a drain of a conventional metal oxide semiconductor thin-film transistor.

The invention is directed to a method of fabricating an organic light emitting device, which can resolve a problem of uneasy control of an etching process of a source and a drain of a conventional metal oxide semiconductor thin-film transistor, and save a fabrication cost.

The invention provides a method of fabricating a pixel structure. The method can be described as follows. A gate electrode is formed on a substrate, and a dielectric layer is formed to cover the gate electrode and the substrate. A patterned metal oxide semiconductor layer and a patterned metallic etching stop layer are formed on the dielectric layer above the gate electrode. A first conductive layer is formed to cover the patterned metallic etching stop layer and the dielectric layer. The patterned metallic etching stop layer is used as an etching stop layer to pattern the first conductive layer, so as to form a source and a drain. A second conductive layer is formed to cover the source, the drain and the dielectric layer. The patterned metallic etching stop layer is used as an etching stop layer to pattern the second conductive layer, so as to form a first electrode layer. After that, the patterned metallic etching stop layer exposed between the source and the drain is removed.

The invention provides a method of fabricating an organic light emitting device. The method can be described as follows. A gate electrode is formed on a substrate, and a dielectric layer is formed to cover the gate electrode and the substrate. A patterned metal oxide semiconductor layer and a patterned metallic etching stop layer are formed on the dielectric layer above the gate electrode. A first conductive layer is formed to cover the patterned metallic etching stop layer and the dielectric layer. The patterned metallic etching stop layer is used as an etching stop layer to pattern the first conductive layer, so as to form a source and a drain. A second conductive layer is formed to cover the source, the drain and the dielectric layer. The patterned metallic etching stop layer is used as an etching stop layer to pattern the second conductive layer, so as to form a first electrode layer. Then, the patterned metallic etching stop layer exposed between the source and the drain is removed. Thereafter, an organic material layer is formed on the substrate, wherein the organic material layer exposes the first electrode layer. A light emitting layer is formed on the exposed first electrode layer. A second electrode layer is formed on the light emitting layer.

According to the above descriptions, since the patterned metallic etching stop layer is used as an etching stop layer to etch the first conductive layer (defining the source and the drain), and the patterned metallic etching stop layer is further used as an etching stop layer to etch the second conductive layer (defining the first electrode layer), the patterned metallic etching stop layer of the invention can prevent excessive etching of the metal oxide semiconductor layer during processes of etching the first conductive layer and the second conductive layer. Moreover, the organic light emitting device of the invention only requires to form one layer of organic layer, so that a fabrication cost is saved.

In order to make the aforementioned and other features and advantages of the invention comprehensible, several exemplary embodiments accompanied with figures are described in detail below.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DETAILED DESCRIPTION OF DISCLOSED EMBODIMENTS

Figure 1:
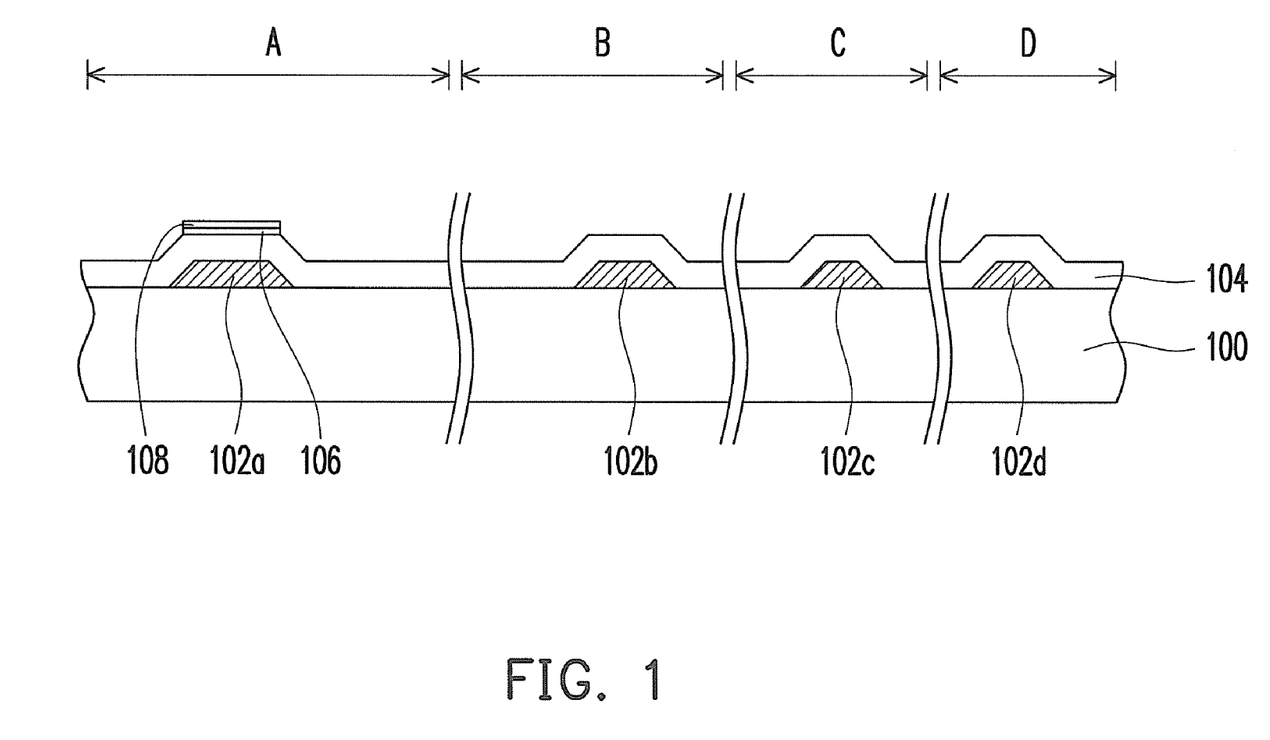
FIGS. 1-11 are schematic diagrams illustrating a fabrication process of an organic light emitting device according to an embodiment of the invention.

FIGS. 1-11 are schematic diagrams illustrating a fabrication process of an organic light emitting device according to an embodiment of the invention. Referring to FIG. 1, a substrate 100 is provided. In the present embodiment, the substrate 100 has a thin-film transistor region A, a capacitor region B, a cross-line region C, and a pad region D. Here, the thin-film transistor region A and the capacitor region B may form a pixel region (a region where a pixel structure is located). The invention is not limited to the above four device regions on the substrate 100, and in other embodiments, the substrate 100 may include any one of, any two of or any three of the thin-film transistor region A, the capacitor region B, the cross-line region C, and the pad region D. According to another embodiment, the substrate 100 may further includes regions other than the above four regions.

Moreover, a material of the substrate 100 can be glass, quartz, organic polymer, or an opaque/reflective material (for example, a conductive material, metal, wafer, porcelain or other suitable materials), or other suitable materials. If the conductive material or the metal is used, an insulation layer (not shown) is covered on the substrate 100 to avoid short circuit.

Then, a gate electrode 102a is formed on the substrate 100. In the present embodiment, the gate electrode 102a is formed in the thin-film transistor region A. While the gate electrode 102a is formed, a scan line (not shown) connected to the gate electrode 102a is further formed. Moreover, a capacitor bottom electrode 102b is formed in the capacitor region B, a lower conductive layer 102c is formed in the cross-line region C, and a pad 102d is formed in the pad region D, wherein the pad 102d is electrically connected to the scan line. A method of forming the gate electrode 102a, the capacitor bottom electrode 102b, the lower conductive layer 102c and the pad 102d is to first deposit a conductive layer, and then the conductive layer is patterned by using a lithography process and an etching process. A material of the conductive layer is, for example, metal.

Then, a dielectric layer 104 is formed to cover the gate electrode 102a and the substrate 100. In the present embodiment, the dielectric layer 104 further covers the capacitor bottom electrode 102b, the lower conductive layer 102c and the pad 102d. A material of the dielectric layer 104 is, for example, silicon dioxide, silicon nitride, silicon oxynitride or other suitable materials.

Then, a patterned metal oxide semiconductor layer 106 and a patterned metallic etching stop layer 108 are formed on the dielectric layer 104 above the gate electrode 102a. In the present embodiment, in a method of forming the patterned metal oxide semiconductor layer 106 and the patterned metallic etching stop layer 108, a metal oxide semiconductor material layer (not shown) and a metallic etching stop material layer (not shown) are consecutively formed, and then a lithography process and an etching process are used to pattern the metal oxide semiconductor material layer and the metallic etching stop material layer. In this way, the patterned metal oxide semiconductor layer 106 and the patterned metallic etching stop layer 108 having a same pattern are formed.

In the present embodiment, the patterned metal oxide semiconductor layer 106 includes indium-gallium-zinc oxide (IGZO), indium-zinc oxide (IZO), gallium-zinc oxide (GZO), zinc-tin oxide (ZTO) or zinc oxide (ZnO).

The patterned metallic etching stop layer 108 includes an aluminium acid etchant stop layer. The so-called aluminium acid etchant stop layer refers to a film layer that can stop an etchant used for etching aluminium. Generally, the etchant (aluminium acid etchant) used for etching aluminium may include a mixture of phosphoric acid, nitric acid and acetic acid. A material used for stopping the aluminium acid etchant can serve as the material of the patterned metallic etching stop layer 108. Therefore, the material of the patterned metallic etching stop layer 108 can be selected from a group consisting of titanium, tungsten, chromium and alloys thereof.

Figure 2:
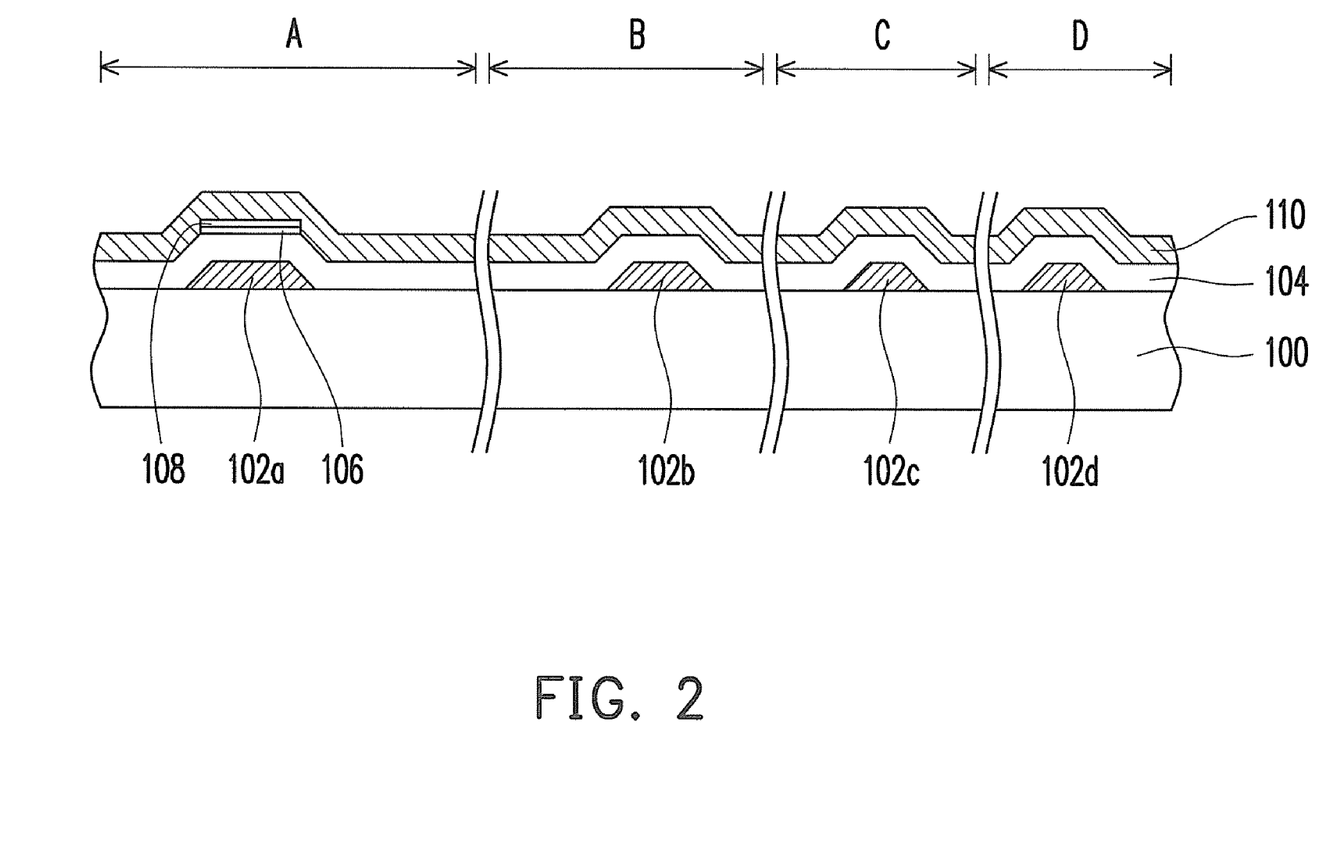

Then referring to FIG. 2, a first conductive layer 110 is formed to cover the patterned metallic etching stop layer 108 and the dielectric layer 104. A material of the first conductive layer 110 is aluminium, molybdenum or an alloy thereof or a stacked layer thereof.

Figure 3:
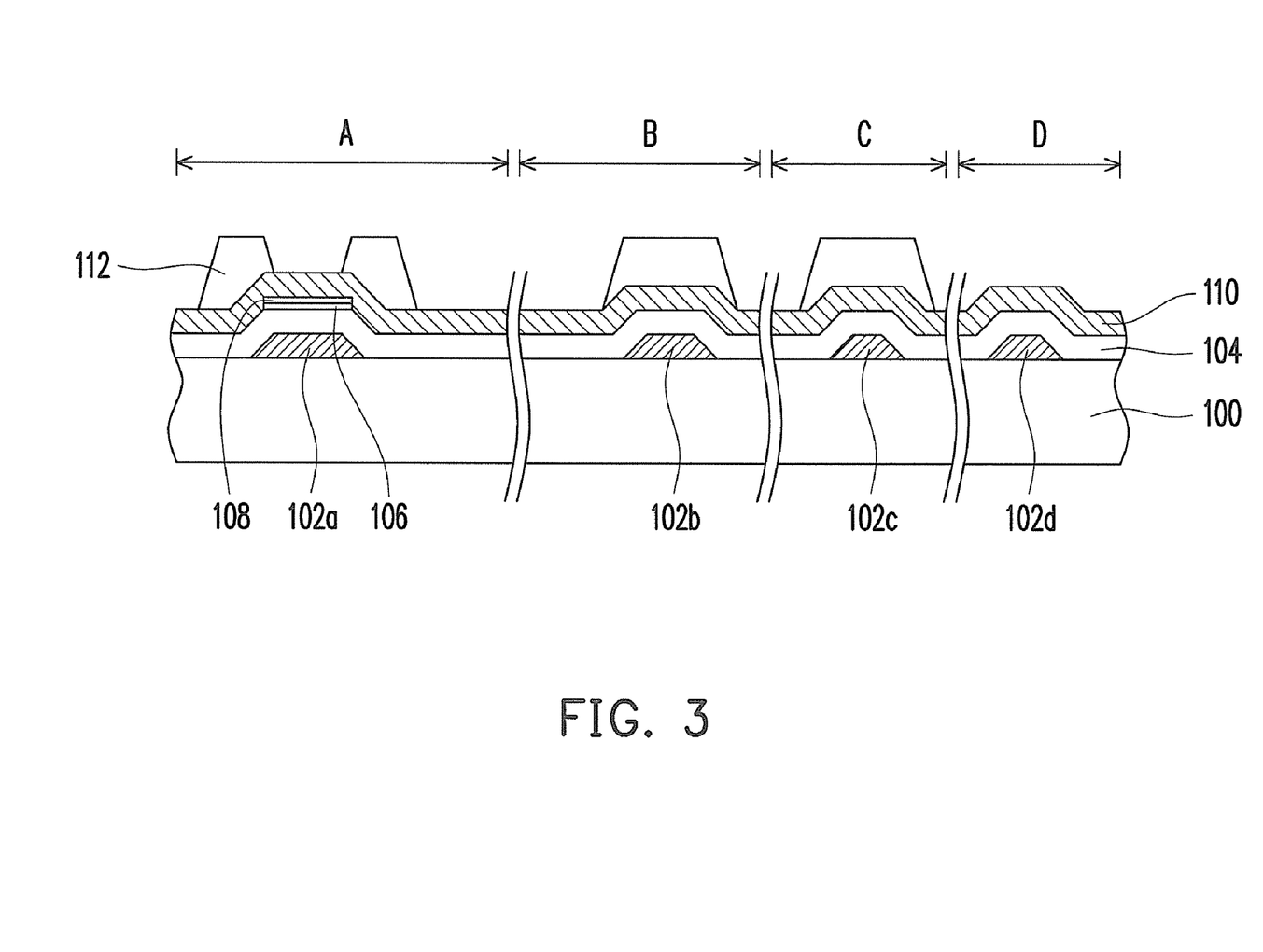

Referring to FIG. 3, a photoresist layer 112 is formed on the first conductive layer 110. In the present embodiment, the photoresist layer 112 covers regions to be developed into a source and a drain at the thin-film transistor region A. The photoresist layer 112 covers a region to be developed into a capacitor top electrode at the capacitor region B. The photoresist layer 112 covers a region to be developed into an upper conductive layer at the cross-line region C.

Figure 4:
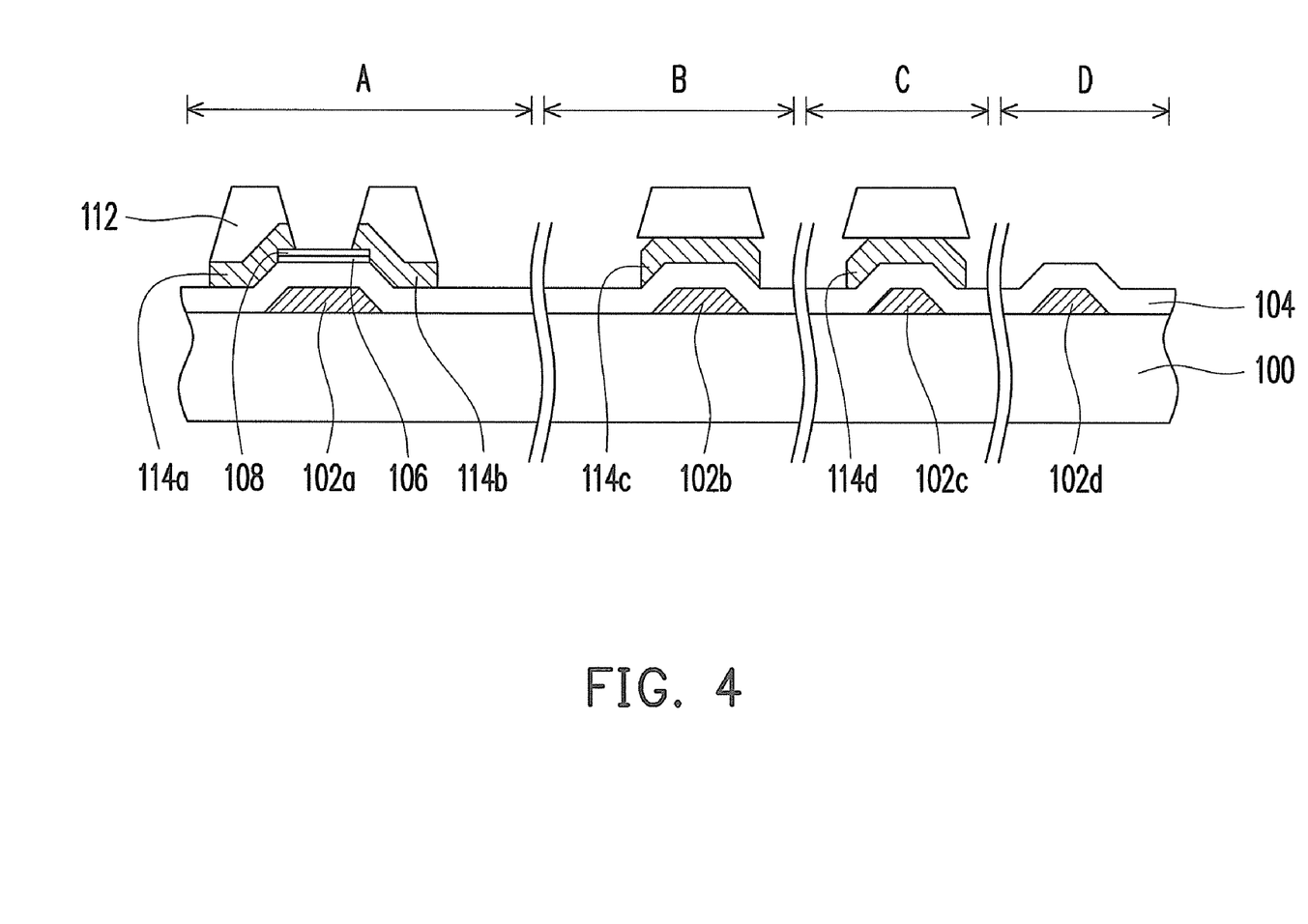

Referring to FIG. 4, the photoresist layer 112 is used as an etching mask to perform an etching process to the first conductive layer 110, so as to form a source 114a and a drain 114b in the thin-film transistor region A. In the present embodiment, the etching process further includes defining a data line (not shown) connected to the source 114a. The etching process further forms a capacitor top electrode 114c in the capacitor region B, and forms an upper conductive layer 114d in the cross-line region C. Here, an etchant used for etching the first conductive layer 110 is, for example, aluminium acid etchant, which includes a mixture of phosphoric acid, nitric acid and acetic acid. Particularly, during the etching process, the patterned metallic etching stop layer 108 serves as an etching stop layer, which may provide enough etching selectivity to achieve an etching stop effect. In other words, the etching process is automatically stopped at the patterned metallic etching stop layer 108, so that the patterned metal oxide semiconductor layer 106 is not influenced by such etching process.

Figure 5:
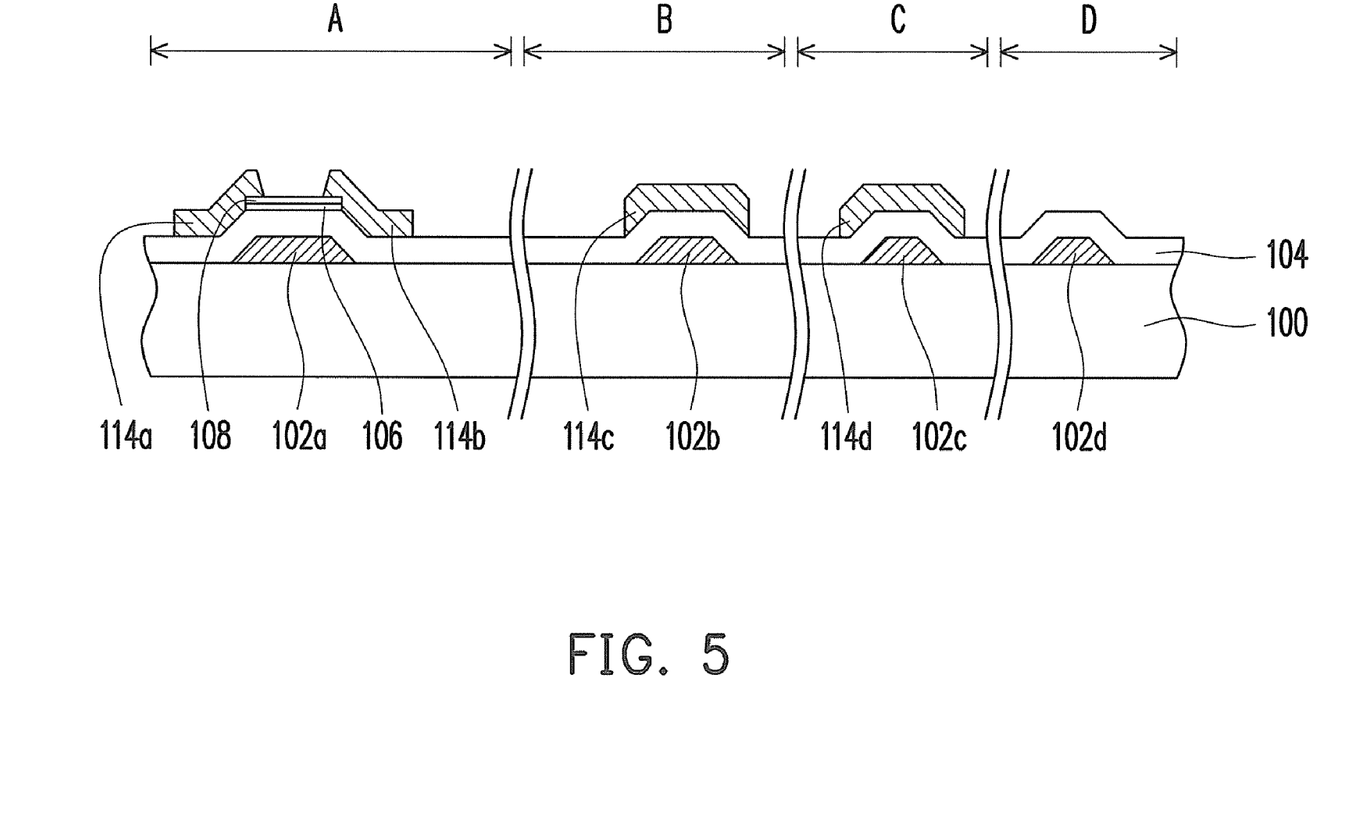
Figure 6:
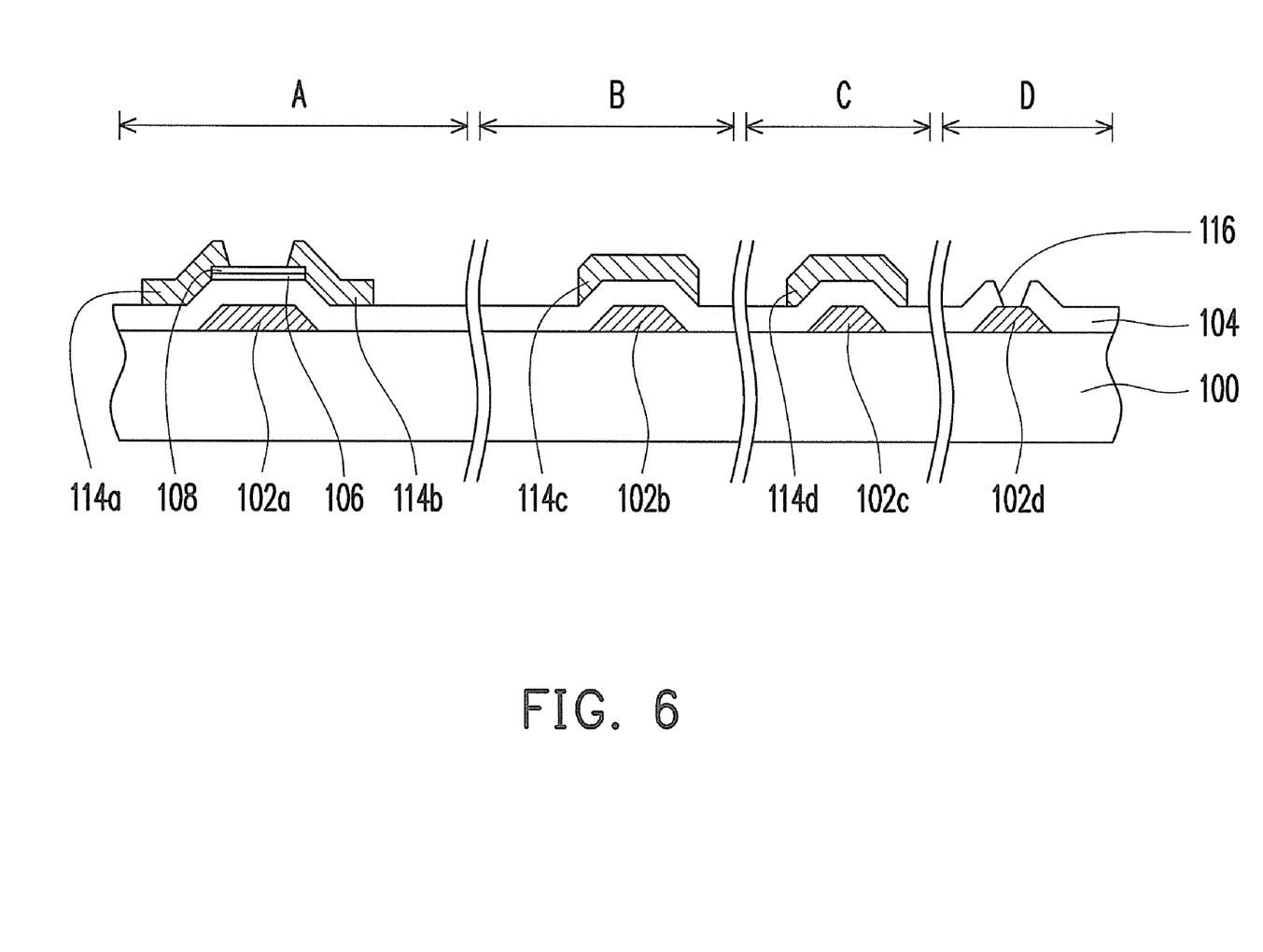

Referring to FIG. 5, the photoresist layer 112 of FIG. 4 is removed to expose the source 114a, the drain 114b, the capacitor top electrode 114c and the upper conductive layer 114d. Then, referring to FIG. 6, an opening 116 is formed in the dielectric layer 104 at the pad region D, and the opening 116 exposes the pad 102d. Similarly, a method of forming the opening in the dielectric layer 104 is, for example, a lithography process and an etching process.

Figure 7:
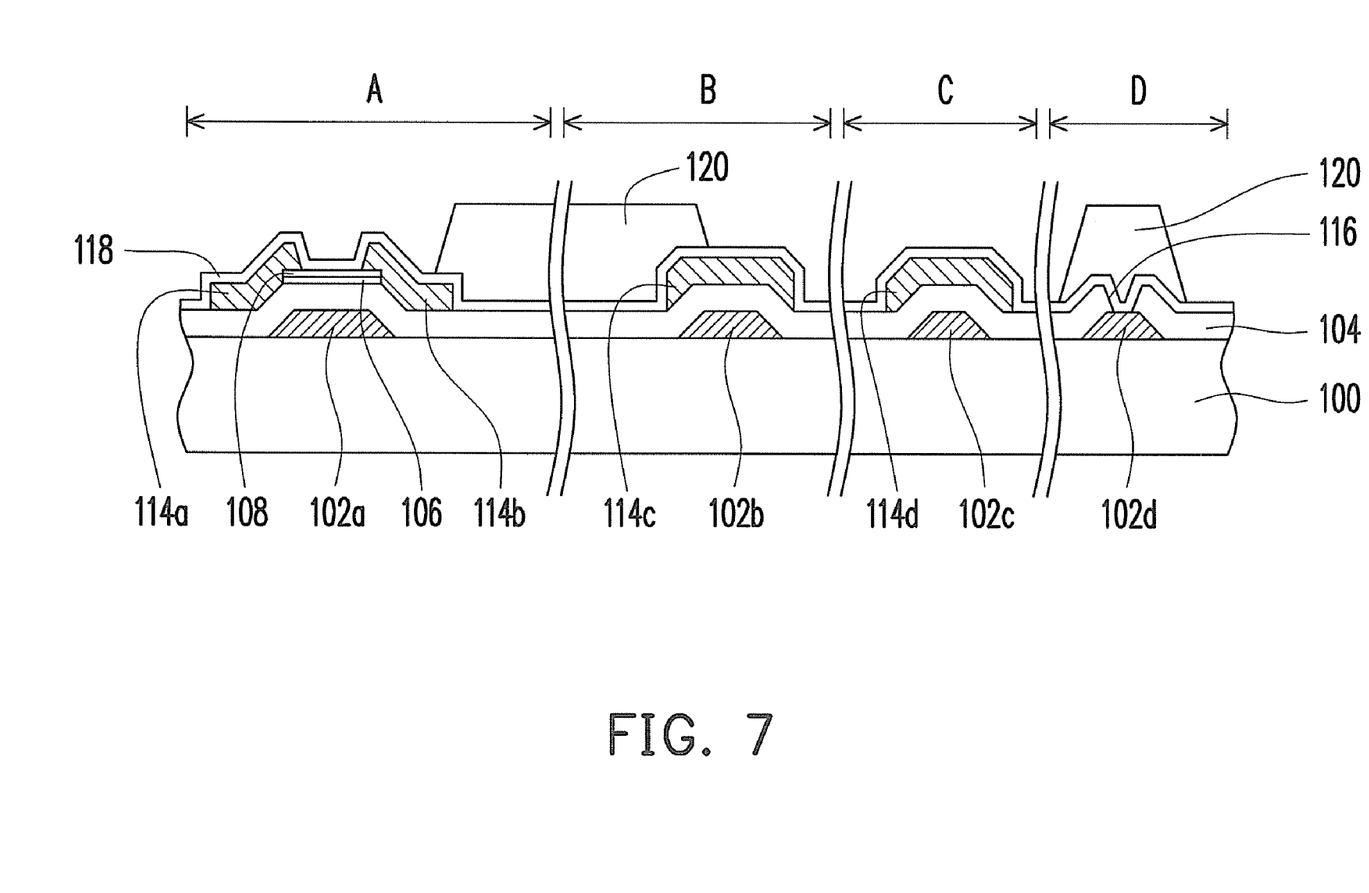

Referring to FIG. 7, a second conductive layer 118 is formed to cover the source 114a, the drain 114b and the dielectric layer 104. In the present embodiment, the second conductive layer 118 further covers the capacitor top electrode 114c, the upper conductive layer 114d and the exposed pad 102d. Here, the second conductive layer 118 includes a transparent conductive layer or a stacked layer of a metal layer and a transparent conductive layer. The transparent conductive layer includes transparent metal oxide such as indium tin oxide (ITO), indium zinc oxide (IZO) or aluminium zinc oxide (AZO), etc., though the invention is not limited thereto.

Then, a photoresist layer 120 is formed on the second conductive layer 118. In the present embodiment, the photoresist layer 120 covers a region to be developed into a first electrode layer. Moreover, the photoresist layer 120 further covers a region to be developed into a pad contact layer in the pad region D.

Figure 8:
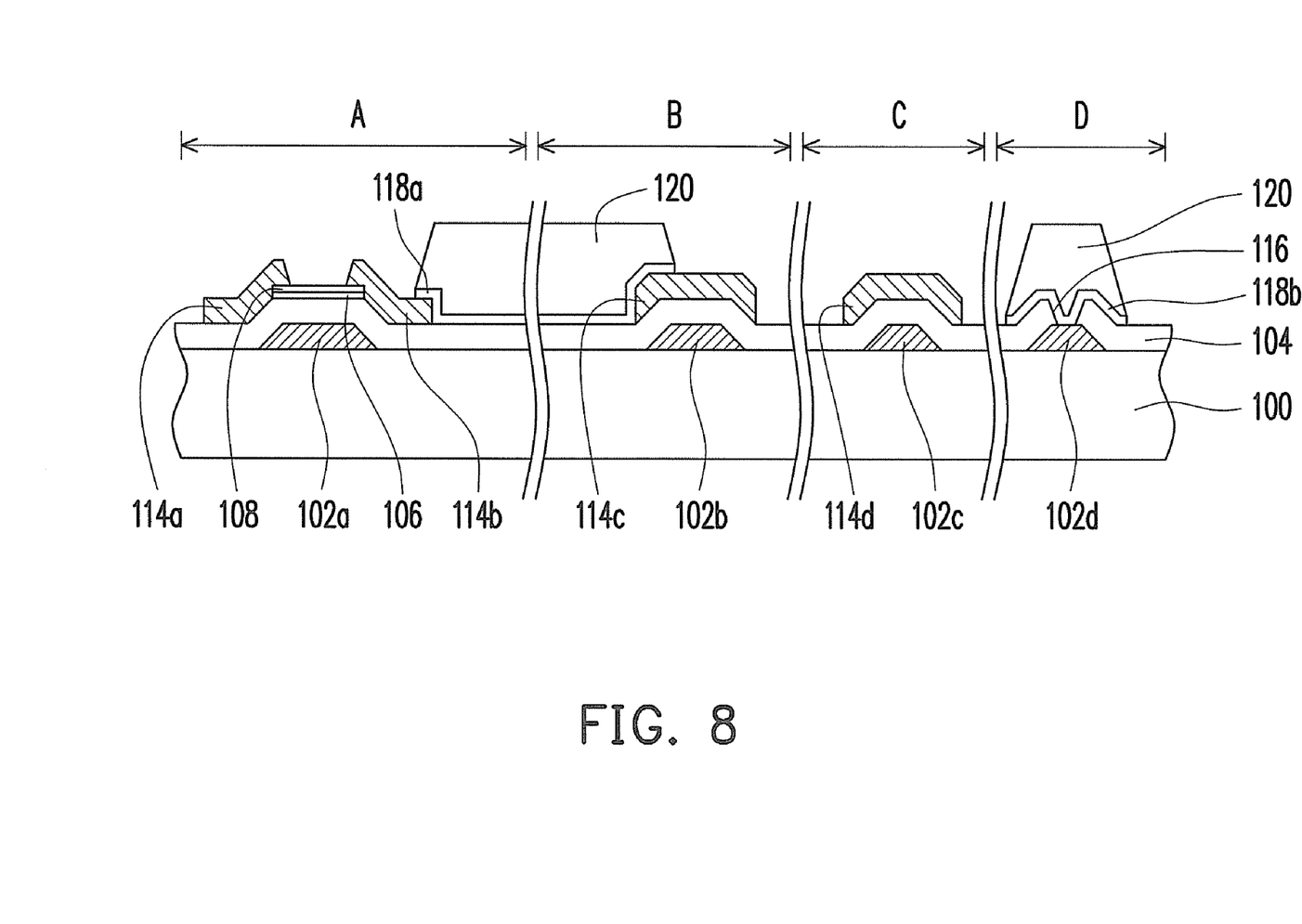

Referring to FIG. 8, the photoresist layer 120 is used as an etching mask to perform an etching process to the second conductive layer 118, so as to form a first electrode layer 118a, and meanwhile form a pad contact layer 118b in the pad region D. In the present embodiment, an etchant used for etching the second conductive layer 118 includes oxalic acid. Particularly, during the etching process, the patterned metallic etching stop layer 108 is again used as the etching stop layer. In other words, the etching process is automatically stopped at the patterned metallic etching stop layer 108, so that the patterned metal oxide semiconductor layer 106 is not influenced by such etching process. Generally, since the material (metal oxide transparent conductive layer) of the second conductive layer 118 is similar to a material composition/characteristic of the patterned metal oxide semiconductor layer 106, for example, the material of the second conductive layer 118 is ITO, and the material of the patterned metal oxide semiconductor layer 106 is indium gallium zinc oxide, so that the etchant used for etching the second conductive layer 118 is liable to etch the patterned metal oxide semiconductor layer 106. Therefore, the patterned metallic etching stop layer 108 on the patterned metal oxide semiconductor layer 106 is used as the etching stop layer to protect the patterned metal oxide semiconductor layer 106 from the etching process.

Then, the patterned metallic etching stop layer 108 exposed between the source 114a and the drain 114b is removed, so as to expose the patterned metal oxide semiconductor layer 106. In the present embodiment, an etching gas used for removing the patterned metallic etching stop layer 108 includes a mixture of boron trichloride ($BCl_3$) and chlorine, or a mixture of sulfur hexafluoride ($SF_6$), carbon tetrafluoride ($CF_4$) and oxygen ($O_2$). After such removing step, a small part of patterned metallic etching stop layer 108a is remained between the source 114a and the patterned metal oxide semiconductor layer 106, and between the drain 114b and the patterned metal oxide semiconductor layer 106, as that shown in FIG. 9.

Figure 9:
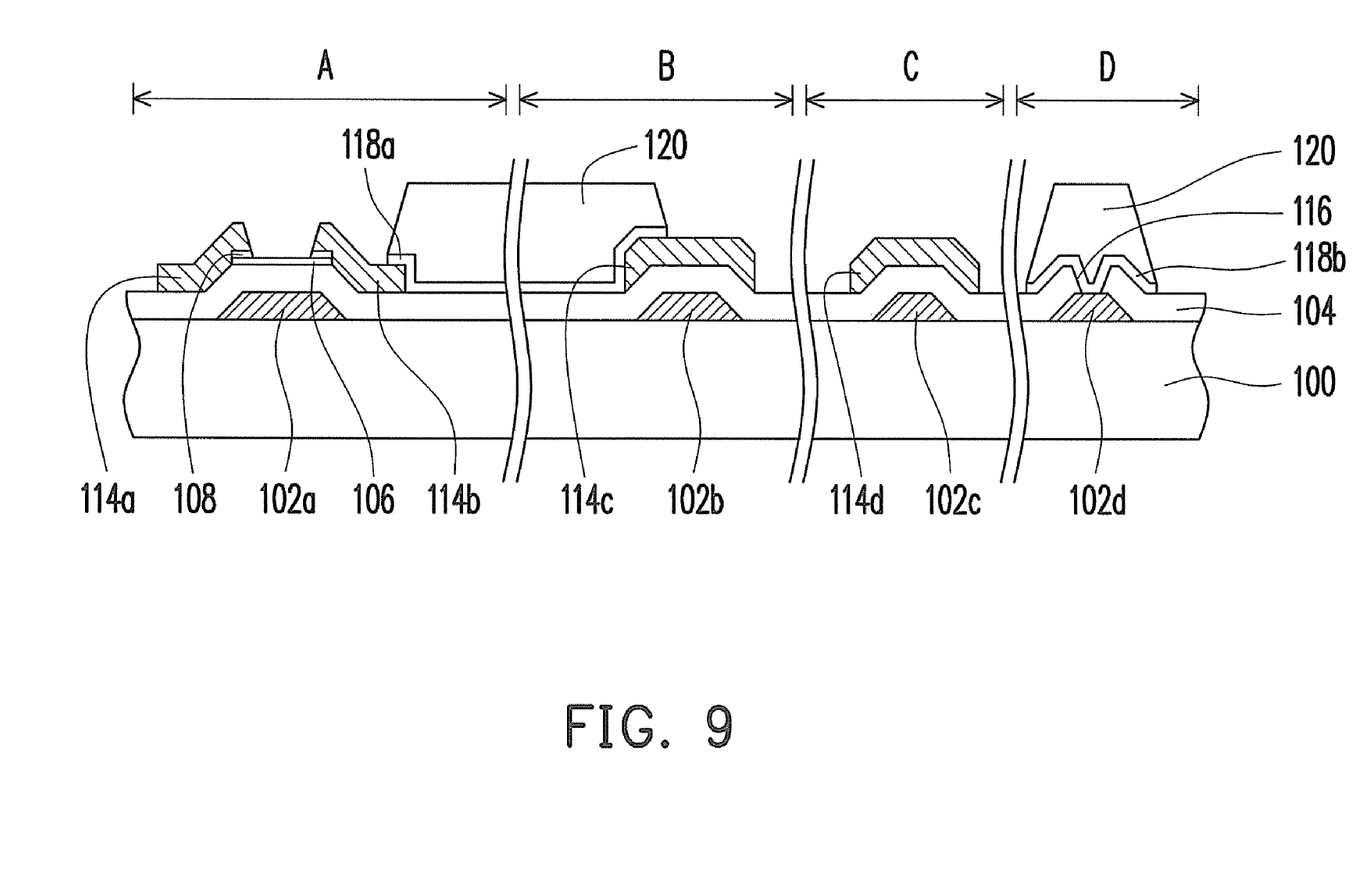

Moreover, the patterned metallic etching stop layer 108a may directly contact the patterned metal oxide semiconductor layer 106, and the source 114a and the drain 114b for electrical connection. If a dielectric material layer such as a silicon nitride layer is used as an aluminium acid etchant and oxalic acid etchant stop layer, although it can stop the aluminium acid etchant and the oxalic acid etchant, the patterned metal oxide semiconductor layer 106 is hard to directly contact the source 114a and the drain 114b for electrical connection, and extra steps are required to remove the dielectric material layer, which may increase a fabrication cost. Moreover, mandatory removal of the dielectric material layer may spoil a structure of the source 114a and the drain 114b, and cause a damage of the device.

Figure 10:
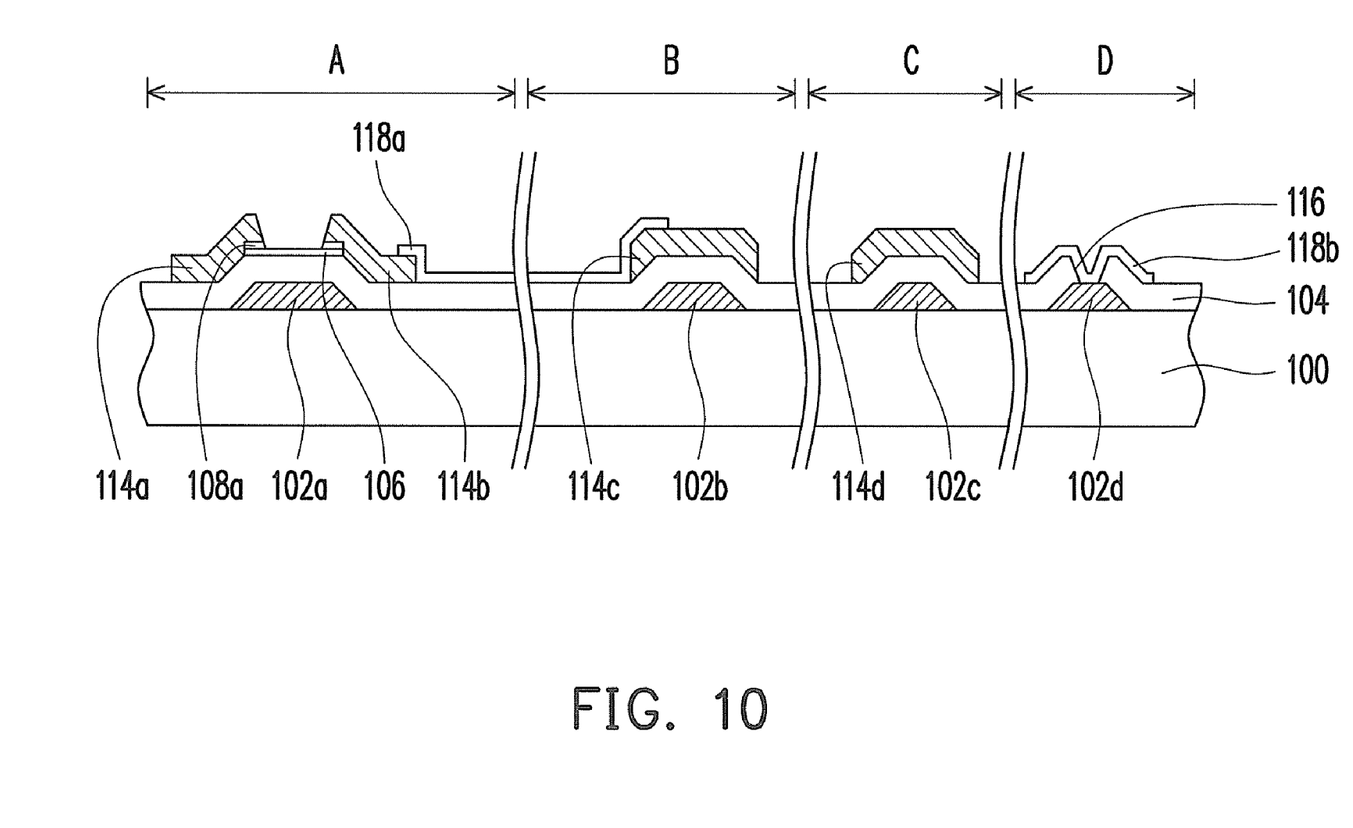

Referring to FIG. 10, the photoresist layer 120 of FIG. 9 is removed to expose the first electrode layer 118a and the pad contact layer 118b. It should be noticed that the first electrode layer 118a electrically contacts the drain 114b of the thin-film transistor, and the first electrode layer 118a is an independent electrode pattern in each pixel region. Moreover, the first electrode layer 118a directly contacts the dielectric layer 104.

Figure 11:
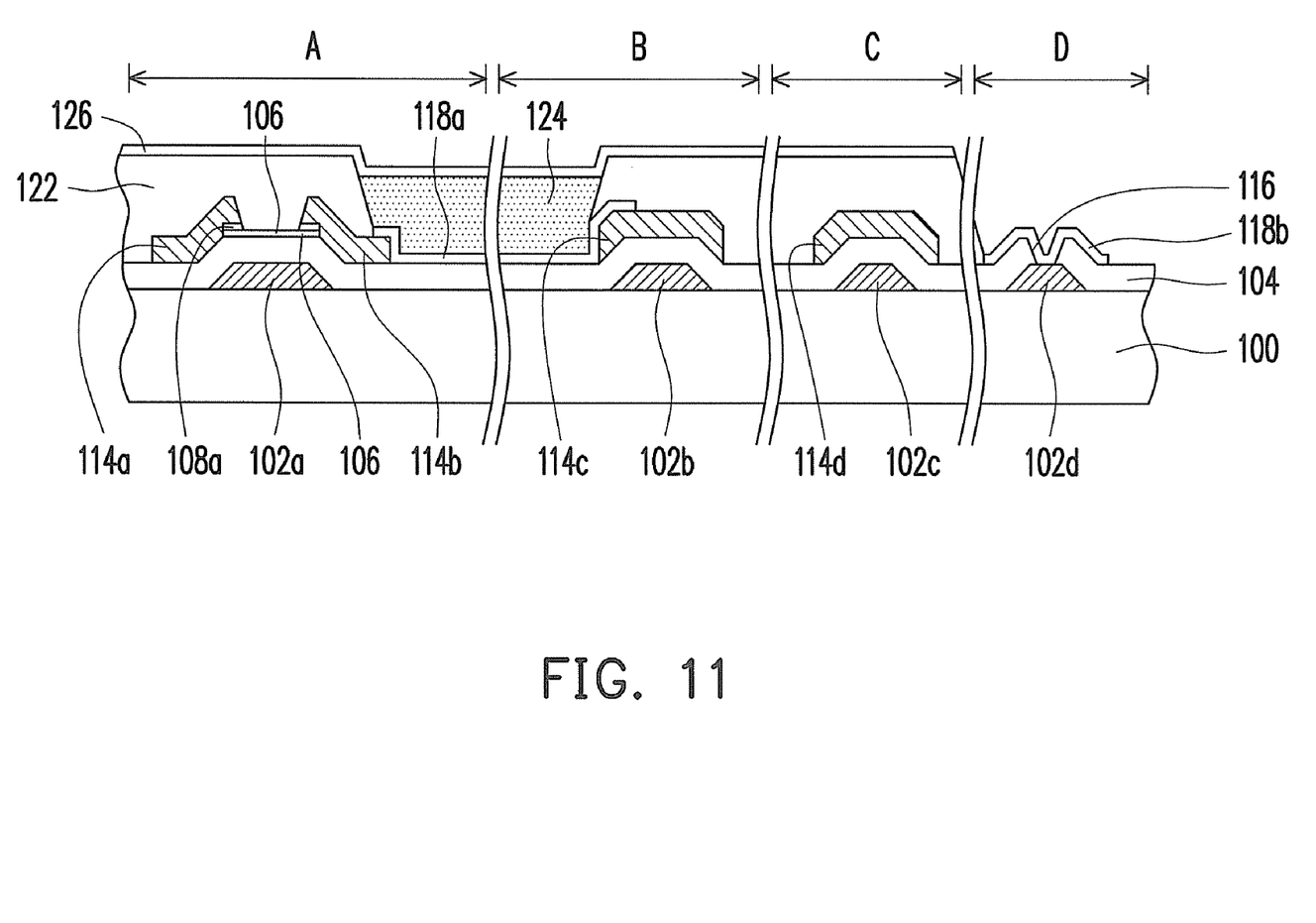

Then, referring to FIG. 11, an organic material layer 122 is formed on the substrate 100, which exposes the first electrode layer 118a. In the present embodiment, the organic material layer 122 further covers a part of the first electrode layer 118a. A method of forming the organic material layer 122 is to first coat a photosensitive organic layer (not shown), and then a lithography process is used to pattern the photosensitive organic layer. The organic material layer 122 exposes the first electrode layer 118a in each pixel region, and covers the first electrode layer 118a located at peripheral of each pixel region.

Then, a light emitting layer 124 is formed on the first electrode layer 118a exposed by the organic material layer 122. The light emitting layer 124 is, for example, an organic light emitting material, which can be a red organic light emitting material, a green organic light emitting material, a blue organic light emitting material, or organic light emitting materials of other colors (for example, white, orange, purple, etc.) in each pixel region. The light emitting layer 124 can be a small molecule organic light emitting material or a polymer organic light emitting material. Then, a second electrode layer 126 is formed on the organic material layer 122 and the light emitting layer 124. The second electrode layer 126 of each pixel region can serve as a common electrode. A material of the second electrode layer 126 can be metal or metal oxide. Generally, the first electrode layer 118a can be served as an anode of the light emitting device, and the second electrode layer 126 can be served as a cathode of the light emitting device.

It should be noticed that materials of the first electrode layer 118a and the second electrode layer 126 can be conductive materials such as metal or metal oxide, etc. If the first electrode layer 118a and the second electrode layer 126 all apply a transparent conductive material, the formed organic light emitting device is a double-sided light emitting device. If one of the first electrode layer 119a and the second electrode layer 126 applies the transparent conductive material, the formed organic light emitting device can be referred to as a bottom emitting type or top emitting type light emitting device. Moreover, an electron transport layer, an electron injection layer, a hole transport layer, a hole injection layer or a combination of the above four film layers (not shown) can be further configured between the first electrode layer 118a and the second electrode layer 126. Since a detailed structure of the above organic light emitting device is already known by those skilled in the art, a detailed description thereof is not repeated.

In summary, since the patterned metallic etching stop layer is used as an etching stop layer to etch the first conductive layer (defining the source and the drain), and the patterned metallic etching stop layer is further used as an etching stop layer to etch the second conductive layer (defining the first electrode layer), the patterned metallic etching stop layer of the invention can prevent excessive etching of the metal oxide semiconductor layer during processes of etching the first conductive layer and the second conductive layer. Moreover, the organic light emitting device of the invention only requires to form one layer of organic layer, in other words, the first electrode layer directly contacts the dielectric layer. Therefore, compared to a conventional method of fabricating an organic light emitting device, the method of fabricating the organic light emitting device of the invention has an advantage of low cost.

It will be apparent to those skilled in the art that various modifications and variations can be made to the structure of the invention without departing from the scope or spirit of the invention. In view of the foregoing, it is intended that the invention cover modifications and variations of this invention provided they fall within the scope of the following claims and their equivalents.

What is claimed is:

1. A method of fabricating a pixel structure on a substrate, comprising:
    forming a gate electrode on the substrate;
    forming a dielectric layer to cover the gate electrode and the substrate;
    forming a patterned metal oxide semiconductor layer and a patterned metallic etching stop layer on the dielectric layer above the gate electrode, wherein the patterned metallic etching stop layer is stacked on the patterned metal oxide semiconductor layer and the metallic etching stop layer is made of a metallic material;

forming a first conductive layer to cover the patterned metallic etching stop layer and the dielectric layer;
patterning the first conductive layer by using the patterned metallic etching stop layer as an etching stop layer to form a source and a drain;
forming a second conductive layer to cover the source, the drain and the dielectric layer;
patterning the second conductive layer by using the patterned metallic etching stop layer as an etching stop layer to form a first electrode layer; and
removing a portion of the patterned metallic etching stop layer exposed between the source and the drain.

2. The method of fabricating the pixel structure as claimed in claim 1, wherein the step of forming the patterned metal oxide semiconductor layer and the patterned metallic etching stop layer comprises:
consecutively forming a metal oxide semiconductor material layer and a metallic etching stop material layer; and
patterning the metal oxide semiconductor material layer and the metallic etching stop material layer to form the patterned metal oxide semiconductor layer and the patterned metallic etching stop layer having a same pattern, wherein the patterned metallic etching stop layer is stacked on the patterned metal oxide semiconductor layer.

3. The method of fabricating the pixel structure as claimed in claim 1, wherein the patterned metallic etching stop layer comprises an aluminium acid and oxalic acid etchant stop layer.

4. The method of fabricating the pixel structure as claimed in claim 1, wherein the metallic material of the patterned metallic etching stop layer is selected from a group consisting of titanium, tungsten, chromium and alloys thereof.

5. The method of fabricating the pixel structure as claimed in claim 1, wherein patterned metal oxide semiconductor layer comprises indium-gallium-zinc oxide (IGZO), indium-zinc oxide (IZO), gallium-zinc oxide (GZO), zinc-tin oxide (ZTO) or zinc oxide (ZnO).

6. The method of fabricating the pixel structure as claimed in claim 1, wherein the second conductive layer comprises a transparent conductive layer or a stacked layer of a metal layer and a transparent conductive layer.

7. The method of fabricating the pixel structure as claimed in claim 6, wherein the transparent conductive layer comprises transparent metal oxide.

8. The method of fabricating the pixel structure as claimed in claim 7, wherein the transparent metal oxide comprises indium tin oxide.

9. The method of fabricating the pixel structure as claimed in claim 1, further comprising:
forming an organic material layer on the substrate, wherein the organic material layer exposes the first electrode layer;
forming a light emitting layer on the exposed first electrode layer; and
forming a second electrode layer on the light emitting layer.

10. The method of fabricating the pixel structure as claimed in claim 9, wherein the first electrode layer directly contacts to the dielectric layer.

11. The method of fabricating the pixel structure as claimed in claim 10, wherein the organic material layer covers a part of the first electrode layer.

12. The method of fabricating the pixel structure as claimed in claim 9, wherein the first electrode layer comprises an anode, and the second electrode layer comprises a cathode.

13. The method of fabricating the pixel structure as claimed in claim 1, wherein an etchant used for patterning the first conductive layer comprises an aluminium acid etchant.

14. The method of fabricating the pixel structure as claimed in claim 13, wherein the aluminium acid etchant is a mixture of phosphoric acid, nitric acid and acetic acid.

15. The method of fabricating the pixel structure as claimed in claim 1, wherein an etchant used for patterning the second conductive layer comprises oxalic acid.

16. The method of fabricating the pixel structure as claimed in claim 1, wherein an etching gas used for removing the patterned metallic etching stop layer exposed between the source and the drain comprises a mixture of boron trichloride and chlorine.

17. The method of fabricating the pixel structure as claimed in claim 1, wherein the metallic etching stop layer prevents the metal oxide semiconductor layer being influenced during patterning the first conductive layer by an etchant.

18. The method of fabricating the pixel structure as claimed in claim 1, wherein the metallic etching stop layer prevents the metal oxide semiconductor layer being influenced during patterning the second conductive layer by an etchant.

19. The method of fabricating the pixel structure as claimed in claim 1, wherein remained portions of the metallic etching stop layer electrically connected the metal oxide semiconductor layer to the source and the drain after removing the portion of the patterned metallic etching stop layer exposed between the source and the drain.

20. A method of fabricating an organic light emitting device on a substrate, comprising:
forming a gate electrode on the substrate;
forming a dielectric layer to cover the gate electrode and the substrate;
forming a patterned metal oxide semiconductor layer and a patterned metallic etching stop layer on the dielectric layer above the gate electrode, wherein the patterned metallic etching stop layer is stacked on the patterned metal oxide semiconductor layer and the metallic etching stop layer is made of a metallic material;
forming a first conductive layer to cover the patterned metallic etching stop layer and the dielectric layer;
pattern the first conductive layer by using the patterned metallic etching stop layer as an etching stop layer to form a source and a drain;
forming a second conductive layer to cover the source, the drain and the dielectric layer;
pattern the second conductive layer by using the patterned metallic etching stop layer as an etching stop layer to form a first electrode layer;
removing a portion of the patterned metallic etching stop layer exposed between the source and the drain;
forming an organic material layer on the substrate, wherein the organic material layer exposes the first electrode layer;
forming a light emitting layer on the exposed first electrode layer; and
forming a second electrode layer on the light emitting layer.

* * * * *